(12) United States Patent
Lin et al.

(10) Patent No.: US 10,600,919 B1
(45) Date of Patent: Mar. 24, 2020

(54) SEMICONDUCTOR STRUCTURE AND METHOD FOR FORMING THE SAME

(71) Applicant: Vanguard International Semiconductor Corporation, Hsinchu (TW)

(72) Inventors: Chih-Hung Lin, Taichung (TW); Chia-Hao Lee, New Taipei (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/150,771

(22) Filed: Oct. 3, 2018

(51) Int. Cl.
*H01L 21/762* (2006.01)
*H01L 29/786* (2006.01)
*H01L 29/49* (2006.01)
*H01L 21/02* (2006.01)

(52) U.S. Cl.
CPC .... *H01L 29/7869* (2013.01); *H01L 21/02164* (2013.01); *H01L 21/02502* (2013.01); *H01L 21/76264* (2013.01); *H01L 29/4908* (2013.01); *H01L 29/78618* (2013.01)

(58) Field of Classification Search
CPC ......... H01L 21/02436; H01L 21/02496; H01L 21/70; H01L 21/71; H01L 21/76291; H01L 21/8232
See application file for complete search history.

(56) References Cited

U.S. PATENT DOCUMENTS

2005/0202600 A1* 9/2005 Yamashita .......... H01L 21/7624
438/149
2016/0086862 A1* 3/2016 Ko ...................... H01L 27/0922
438/221

* cited by examiner

*Primary Examiner* — Cheung Lee
(74) *Attorney, Agent, or Firm* — Birch, Stewart, Kolasch & Birch, LLP (57) ABSTRACT

A semiconductor structure is provided. The semiconductor structure includes a substrate, a first oxide layer disposed over the substrate, a second oxide layer, and a semiconductor layer disposed over the second oxide layer. The second oxide layer is disposed at one side of the first oxide layer and is in contact with the first oxide layer. The second oxide layer partially overlaps the first oxide layer, and the first oxide layer and the second oxide layer include the same oxide.

18 Claims, 5 Drawing Sheets

SEMICONDUCTOR STRUCTURE AND METHOD FOR FORMING THE SAME

BACKGROUND

Technical Field

The present disclosure relates to a semiconductor structure and a method for forming the semiconductor structure. The disclosure in particular relates to a semiconductor substrate and a method for forming the semiconductor substrate.

Description of the Related Art

Semiconductor devices are used in a variety of electronic applications, such as personal computers, cell phones, and digital cameras. Semiconductor devices are typically fabricated by sequentially depositing insulating layers or dielectric layers, conductive layers, and semiconductor layers over a semiconductor substrate, and patterning the various material layers using lithography to form circuit components and electronic elements.

In the semiconductor industry, silicon-on-insulator (SOI) is a term that refers to a silicon-insulator-silicon substrate which can replace conventional silicon substrates. The silicon-on-insulator includes a buried oxide layer sandwiched between the base silicon layer and the top silicon layer. Compared to conventional bulk silicon substrates, silicon-on-insulator substrates may have lower leakage current, higher power efficiency, and lower parasitic capacitance.

However, compared with a device that does not have a silicon-on-insulator substrate, a device having a silicon-on-insulator substrate generally has the problem of poor heat dissipation, and excessive heat accumulation may cause a decline in saturation-region drain current (Idsat). In addition, a device having a silicon-on-insulator substrate may suffer from the backside bias effect, which is also called the substrate bias effect. The backside bias effect may alter the breakdown voltage of a metal-oxide-semiconductor field-effect transistor (MOSFET).

Although existing silicon-on-insulator substrates of semiconductor devices and methods for forming the same have been adequate for their intended purposes, they have not been entirely satisfactory in all respects. Therefore, up to the present, there are still some problems that can be improved in the technology of silicon-on-insulator substrates of semiconductor devices.

SUMMARY

In accordance with some embodiments of the present disclosure, a semiconductor structure is provided. The semiconductor structure includes a substrate, a first oxide layer, a second oxide layer, and a semiconductor layer. The first oxide layer is disposed over the substrate. The second oxide layer is disposed on one side of the first oxide layer and is in contact with the first oxide layer. The second oxide layer partially overlaps the first oxide layer. The first oxide layer and the second oxide layer comprise the same oxide. The semiconductor layer is disposed over the second oxide layer.

In accordance with some embodiments of the present disclosure, a method for forming a semiconductor structure is provided. The method includes: providing a substrate; forming a first oxide layer over the substrate; forming a semiconductor layer over the first oxide layer; and forming a second oxide layer on the surface of the first oxide layer by performing an ion implantation process. The second oxide layer partially overlaps the first oxide layer, and the first oxide layer and the second oxide layer comprise the same oxide.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

The semiconductor structure of the present disclosure and the method for forming the semiconductor structure are described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first material layer disposed on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher". It should be understood that this description of the exemplary embodiments is intended to be read in connection with the accompanying drawings, which are to be considered part of the entire written description. The drawings are not drawn to scale. In fact, the dimensions of the various features may be arbitrarily increased or reduced for clarity of discussion. In addition, the same or similar elements will be denoted by the same or similar reference numerals in the specification and drawings.

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another region, layer or section. Thus, a first element, component, region, layer, portion or section discussed below could be termed a second element, component, region, layer, portion or section without departing from the teachings of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In addition, in some embodiments of the present disclosure, terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

In accordance with some embodiments of the present disclosure, the term "overlap" means that two elements overlap in the normal direction of the substrate. The normal direction is, for example, the normal direction of the top surface of the substrate.

In accordance with some embodiments provided in the present disclosure, the semiconductor structure has a silicon-on-insulator substrate that includes a buried oxide (BOX) layer being thicker in a certain region so as to modulate the body effect. The buried oxide layer may have a thinner thickness in a region corresponding to the position with poorer heat dissipation in the semiconductor structure, and the buried oxide layer corresponding to other regions may have a thicker thickness. With such a configuration, the parasitic effect and the backside bias effect of the semiconductor device can be reduced, while the heat dissipation effect of the semiconductor device can also be improved. Therefore, the overall performance of the semiconductor device can be improved. For example, the performance of the saturation-region drain current (Idsat) and the breakdown voltage can be further improved in accordance with some embodiments.

FIGS. 1A-1E illustrate cross-sectional views of a semiconductor structure 10 during the manufacturing process in accordance with some embodiments of the present disclosure. It should be understood that additional operations can be provided before, during, and after the manufacturing process of the semiconductor structure in accordance with some embodiments. In some other embodiments, some of the operations described can be replaced or eliminated. In addition, additional features may be added to the semiconductor structure in accordance with some embodiments. In some other embodiments, some of the features described below may be replaced or eliminated.

Figure 1A:
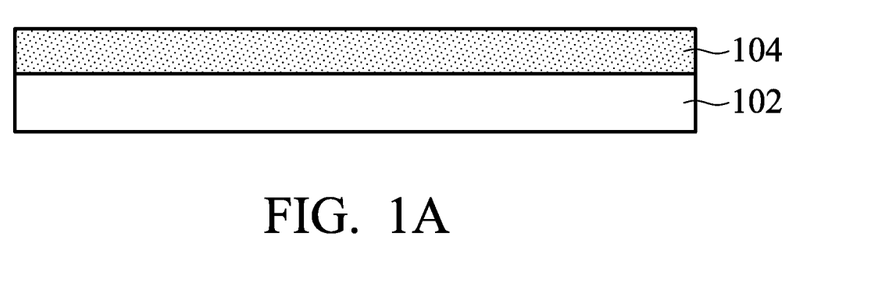
FIGS. 1A-1E illustrate cross-sectional views of the semiconductor structure during the manufacturing process in accordance with some embodiments of the present disclosure.

First, as shown in FIG. 1A, a substrate 102 is provided, and a first oxide layer 104 is formed over the substrate 102. The substrate 102 may be formed of silicon or other semiconductor materials. In some embodiments, the substrate 102 may include other elementary semiconductor materials such as germanium (Ge). In some embodiments, the substrate 102 may be formed of compound semiconductor materials such as silicon carbide (SiC), gallium nitride (GaN), gallium arsenide (GaAs), indium arsenide (InAs), indium phosphide (InP), other applicable materials or a combination thereof. In some other embodiments, the substrate 102 may be formed of alloy semiconductor materials such as silicon germanium (SiGe), silicon germanium carbide (SiGeC), arsenide gallium phosphide (AsGaP), indium gallium phosphide (InGaP), other applicable materials or a combination thereof. In addition, the substrate 102 is the substrate having n-type conductivity in accordance with some embodiments. In some other embodiments, the substrate 102 is the substrate having p-type conductivity.

The first oxide layer 104 may serve as a buried oxide (BOX) layer. The first oxide layer 104 may be formed of oxide materials. In some embodiments, the first oxide layer 104 includes silicon oxide. In some embodiments, the thickness of the first oxide layer 104 is in a range from about 0.1 μm to about 1 μm, or in a range from about 0.3 μm to about 0.6 μm.

Figure 1B:
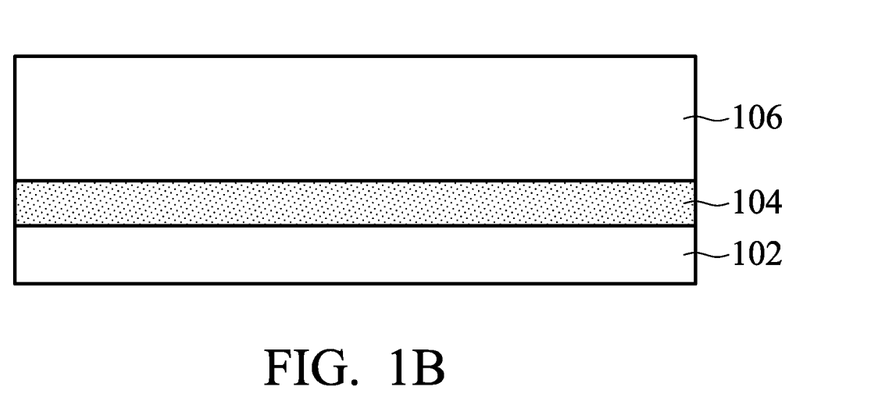

Next, referring to FIG. 1B, a semiconductor layer 106 is formed over the first oxide layer 104. The substrate 102, the first oxide layer 104 and the semiconductor layer 106 may serve as a silicon-on-insulator substrate. The semiconductor layer 106 may be formed of semiconductor materials. In some embodiments, the semiconductor layer 106 includes silicon (Si) such as crystalline silicon (c-Si). The semiconductor layer 106 may include n-type dopants or p-type dopants in accordance with some embodiments. In other words, the semiconductor layer 106 may have n-type conductivity or p-type conductivity. In some embodiments, the thickness of the semiconductor layer 106 is in a range from about 0.5 μm to about 5 μm, or in a range from about 1 μm to about 3 μm.

In some embodiments, the substrate 102, the first oxide layer 104 and the semiconductor layer 106 may be formed by a seed growth method, a wafer bonding process, other applicable processes or a combination thereof. In the embodiments where a seed growth method is applied (e.g., the embodiments as shown in FIGS. 1A and 1B), the first oxide layer 104 may be formed over the substrate 102 first, and then the semiconductor 106 may be epitaxially grown on the first oxide layer 104. In some embodiments, the epitaxial growth process includes a molecular beam epitaxy (MBE) process, a liquid phase epitaxy (LPE) process, solid phase epitaxy (SPE) process, vapor phase epitaxy (VPE) process, selective epitaxial growth (SEG) process, metal organic chemical vapor deposition (MOCVD) process, atomic layer deposition (ALD) or a combination thereof.

On the other hand, in the embodiments where a wafer bonding process is applied, oxidized silicon may be directly bonded to the semiconductor layer 106 to form the first oxide layer 104 below the semiconductor layer 106. Then, the semiconductor layer 106 may be thinned before the first oxide layer 104 and the semiconductor layer 106 are bonded to the substrate 102.

In some other embodiments, the substrate 102, the first oxide layer 104 and the semiconductor layer 106 may be formed by a separation by implantation of oxygen (SIMOX) process. In the separation by implantation of oxygen process, an oxygen ion beam is implanted into the silicon wafer with high energy. Then, the implanted oxygen ion will react with the silicon, and the first oxide layer 104 may be formed below the surface of the silicon wafer by using a high-temperature annealing process. In this process, the portion of the silicon wafer below the first oxide layer 104 is the substrate 102, and the portion of the silicon wafer above the first oxide layer 104 is the semiconductor layer 106. In some embodiments, the dopant concentration of the ion implantation process for forming the first oxide layer 104 may be in a range from about $1\times10^{12}$ atoms/cm$^2$ to about $1\times10^{15}$ atoms/cm$^2$.

Figure 1C:
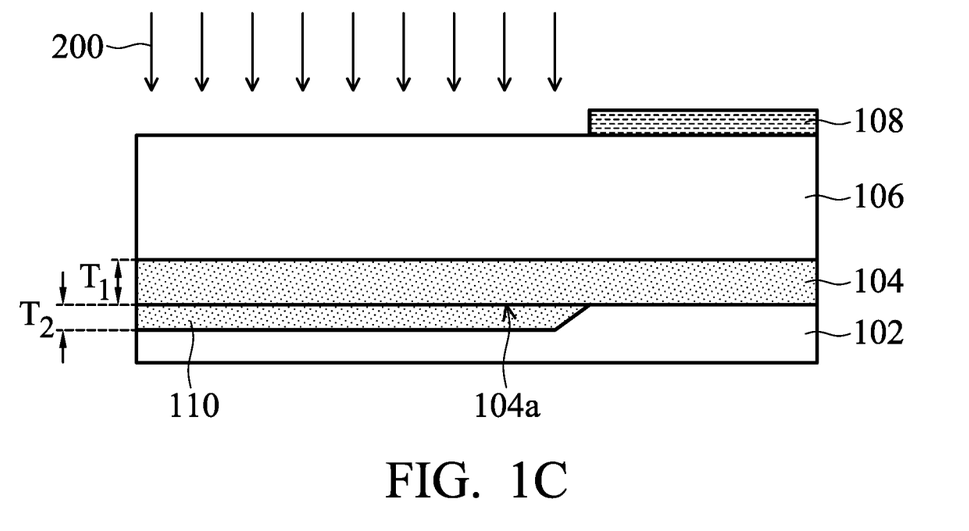
Figure 1D:
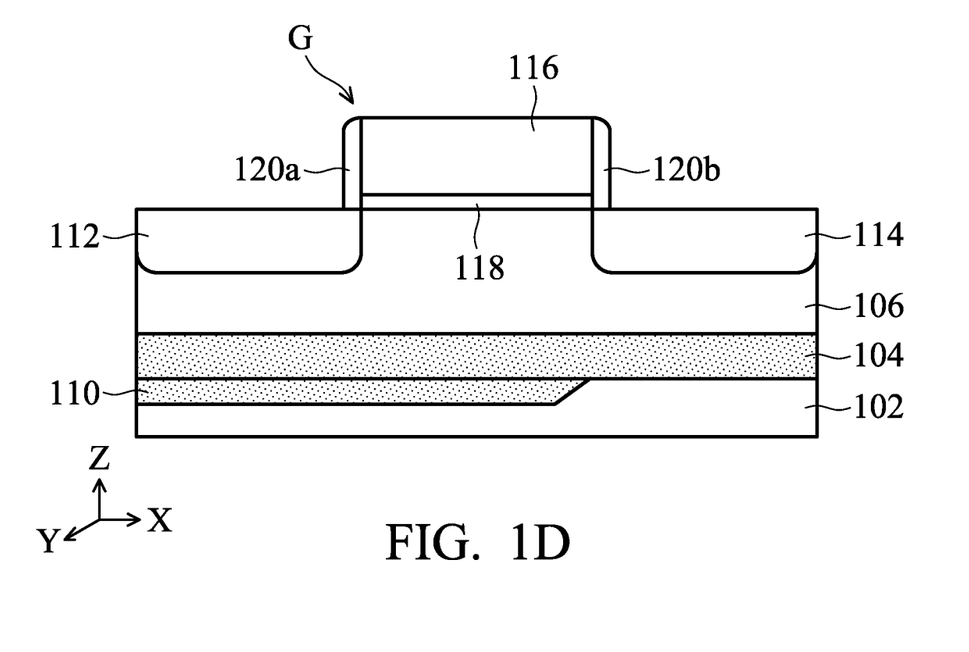

Next, referring to FIG. 1C, a second oxide layer 110 is formed at one side of the first oxide layer 104 by performing an ion implantation process 200. In addition, the second oxide layer 110 is in contact with the first oxide layer 104. Specifically, the second oxide layer 110 is formed on a first surface 104a of the first oxide layer 104, and the first surface 104a is an interface between the first oxide layer 104 and the substrate 102. The second oxide layer 110 extends from the first surface 104a toward the substrate 102. In other words, the second oxide layer 110 may be disposed between the substrate 102 and the first oxide layer 104. Moreover, the position or profile of the second oxide layer 110 can be defined by forming a mask layer 108 over a portion of the semiconductor layer 106 in accordance with some embodiments. In some embodiments, the mask layer 108 may be formed over the portion of the semiconductor layer 106 that will overlap a subsequently formed second well region 114 (as shown in FIG. 1D). As shown in FIG. 1D, the second oxide layer 110 partially overlaps the first oxide layer 104.

In some embodiments, the first oxide layer 104 has a first thickness $T_1$ and the second oxide layer 110 has a second thickness $T_2$. As described above, in some embodiments, the first thickness $T_1$ of the first oxide layer 104 may be in a range from about 0.1 um to about 1 um, or in a range from about 0.3 um to about 0.6 um. In some embodiments, the second thickness $T_2$ of the second oxide layer 110 may be in a range from about 0.1 um to about 1 um, or in a range from about 0.2 um to about 0.5 um. In addition, the ratio of the first thickness $T_1$ to the second thickness $T_2$ may be in a range from about 10:1 to about 1:1, or in a range from about 5:1 to about 2:1 in accordance with some embodiments. It should be understood that the shape and profile of the second oxide layer 110 are not limited to those illustrated in the figures. In some other embodiments, the second oxide layer 110 may have any other suitable shape and profile according to needs.

In some embodiments, the above mask layer 108 may include silicon oxide, silicon nitride, nitrogen oxide, silicon carbide, titanium oxide, titanium nitride, tantalum oxide, tantalum nitride, other applicable materials, or a combination thereof. In some embodiments, the mask layer 108 may be formed over the semiconductor layer 106 by using a chemical vapor deposition (CVD) process, a thermal oxidation process, a physical vapor deposition (PVD) process, other applicable processes or a combination thereof. The chemical vapor deposition process may include a low-pressure chemical vapor deposition (LPCVD) process, a low-temperature chemical vapor deposition (LTCVD) process, a rapid thermal chemical vapor deposition (RTCVD) process, a plasma enhanced chemical vapor deposition (PECVD) process or an atomic layer deposition (ALD) process and so on.

The second oxide layer 110 also serves as a portion of the buried oxide layer in accordance with some embodiments. The second oxide layer 110 may be formed of oxide materials. In some embodiments, the second oxide layer 110 includes silicon oxide. In some embodiments, the first oxide layer 104 and the second oxide layer 110 include the same oxide. In some embodiments, both the first oxide layer 104 and the second oxide layer 110 include silicon oxide such as silicon dioxide. In some embodiments, the composition of the first oxide layer 104 is substantially the same as the composition of the second oxide layer 110. The second oxide layer 110 can be considered as a local oxidation of silicon (LOCOS) element in accordance with some embodiments.

In particular, the second oxide layer 110 is formed by performing the ion implantation process 200 after the first oxide layer 104 is formed. In some embodiments, the first oxide layer 104 and the second oxide layer 110 are formed by separate processes. In some embodiments, the ion implantation process 200 is an oxygen ion implantation process. The oxygen ion beam is implanted into the substrate 102 with high energy in the ion implantation process 200, and then the implanted oxygen ions will react with silicon in the substrate 102 to form the second oxide layer 110. Specifically, since the interface between the first oxide layer 104 and the substrate 102 (i.e. the first surface 104a) has more dangling bonds, the ion implantation process 200 may implant oxygen ions to the first surface 104a and the oxygen ions may further extend to the substrate 102 to form the second oxide layer 110. In some embodiments, the dopant concentration of the ion implantation process 200 may be less than about $1\times10^{16}$ atoms/cm$^2$. For example, in some embodiments, the dopant concentration of the ion implantation process 200 may be in a range from about $1\times10^{12}$ atoms/cm$^2$ to about $1\times10^{16}$ atoms/cm$^2$. In some embodiments, the energy of the ion implantation process that is used to form the first oxide layer 104 is less than the energy of the ion implantation process 200 that is used to form the second oxide layer 110.

Furthermore, after the ion implantation process 200 is carried out, an annealing process may be performed to complete the formation of the second oxide layer 110 in accordance with some embodiments. In some embodiments, the temperature of the annealing process may be in a range from about 500° C. to about 1100° C. In some embodiments, the annealing process is a rapid thermal annealing (RTA) process.

Next, referring to FIG. 1D, the first well region 112 and the second well region 114 may be formed in the semiconductor layer 106 in accordance with some embodiments. The first well region 112 is adjacent to the second well region 114. In some embodiments, the first well region 112 and the second well region 114 are separated from each other by a distance. In some embodiments, the first well region 112 has a first conductivity type and the second well region 114 has a second conductivity type that is opposite to the first conductivity type. In some embodiments, the first well region 112 and the second well region 114 may serve as a source region and a drain region, respectively. As described above, the second oxide layer 110 may be formed first, and then the first well region 112 and the second well region 114 are formed in accordance with some embodiments. However, in some other embodiments, the first well region 112 and the second well region 114 may be formed first, and then the second oxide layer 110 is formed.

In some embodiments, the first well region 112 and the second well region 114 may be formed by an ion implantation process, a diffusion process, or a combination thereof. In some embodiments, the first well region 112 and the second well region 114 may be formed by two separate processes, respectively. In some embodiments, the first well region 112 and the second well region 114 may include n-type dopants and p-type dopants, respectively.

In addition, a gate stack structure G may further be formed over the semiconductor layer 106 in accordance with some embodiments. The gate stack structure G may be disposed between the first well region 112 and the second well region 114. In some embodiments, the gate stack structure G partially overlaps the first well region 112 and the second well region 114. In some embodiments, the gate stack structure G may include a gate electrode layer 116, a gate dielectric layer 118, and spacer elements 120a and 120b and so on.

In some embodiments, the gate electrode layer 116 may include amorphous silicon, polycrystalline silicon, metal nitride, conductive metal oxide, metal, other applicable materials, or a combination thereof. The above metal may include, but is not limited to, aluminum (Al), molybdenum (Mo), tungsten (W), titanium (Ti), tantalum (Ta), platinum (Pt), hafnium (Hf), or a combination thereof. The above conductive metal oxide may include, but is not limited to, ruthenium metal oxide or indium tin metal oxide. In some embodiments, the gate electrode layer 116 may be formed by a chemical vapor deposition (CVD) process, a sputtering process, a resistance heating evaporation process, an electron beam evaporation process, a pulsed laser deposition process, or other applicable processes.

In some embodiments, the gate dielectric layer 118 may include silicon oxide, silicon nitride, silicon oxynitride, high-k dielectric materials, other applicable dielectric materials, or a combination thereof. The high-k dielectric material may include, but is not limited to, metal oxide, metal nitride, metal silicide, metal aluminate, zirconium silicate, zirconium aluminate, other applicable materials or a combination thereof. In some embodiments, the gate dielectric layer 118 may be formed by a plasma enhanced chemical vapor deposition (PECVD) process, a spin coating process, other applicable processes, or a combination thereof.

In some embodiments, the spacer elements 120a and 120b are formed of dielectric materials. In some embodiments, the spacer elements 120a and 120b may be formed of silicon nitride, silicon oxynitride, silicon carbide, other applicable materials or a combination thereof. In some embodiments, the spacer elements 120a and 120b may be formed by a chemical vapor deposition (CVD) process, a physical vapor deposition (PVD) process, a spin coating process, other applicable processes, or a combination thereof.

Furthermore, a patterning process may be performed on the gate electrode layer 116, the gate dielectric layer 118 and the spacer elements 120a and 120b to form the gate stack structure G in accordance with some embodiments. The patterning process may include a photolithography process and an etching process. The photolithography process may include, but is not limited to, photoresist coating (e.g., spin coating), soft baking, hard baking, mask aligning, exposure, post-exposure baking, developing the photoresist, rinsing, drying, or other applicable processes. The etching process may include dry etching process or wet etching process.

As described above, in some embodiments, the mask layer 108 is formed over the portion of the semiconductor layer 106 that overlaps the second well region 114, and then the second oxide layer 110 is formed. In this way, the second oxide layer 110 does not overlap the second well region 114. In some embodiments, the second oxide layer 110 overlaps the first well region 112. More specifically, the second oxide layer 110 overlaps the first well region 112 in the normal direction of the substrate 102 (the Z direction as shown in the figure). The second oxide layer 110 overlaps the first well region 112 and does not overlap the second well region 114 in the normal direction of the substrate 102 in accordance with some embodiments. The second oxide layer 110 also partially or entirely overlaps the gate stack structure G in the normal direction of the substrate 102 in accordance with some embodiments.

As described above, the first oxide layer 104 and the second oxide layer 110 may together serve as the buried oxide layer of the silicon-on-insulator substrate. In particular, the buried oxide layer may be thicker in a region corresponding to the channel region and/or the source region (e.g., the first well region 112) of the semiconductor device (i.e. corresponding to the region where the second oxide layer 110 is disposed). Thereby, the influence of the parasitic effect and the back-side bias effect on the semiconductor device can be reduced. On the other hand, a great amount of heat is usually generated at a position of the drain region that is near to the drift region of the channel. Therefore, the buried oxide layer may be thinner in a region corresponding to the vicinity of the drain region (e.g., the second well region 114) of the semiconductor device (i.e., corresponding to the region where the second oxide layer 110 is not disposed). Thereby, the heat dissipation effect of the silicon-on-insulator substrate can be improved.

Figure 1E:
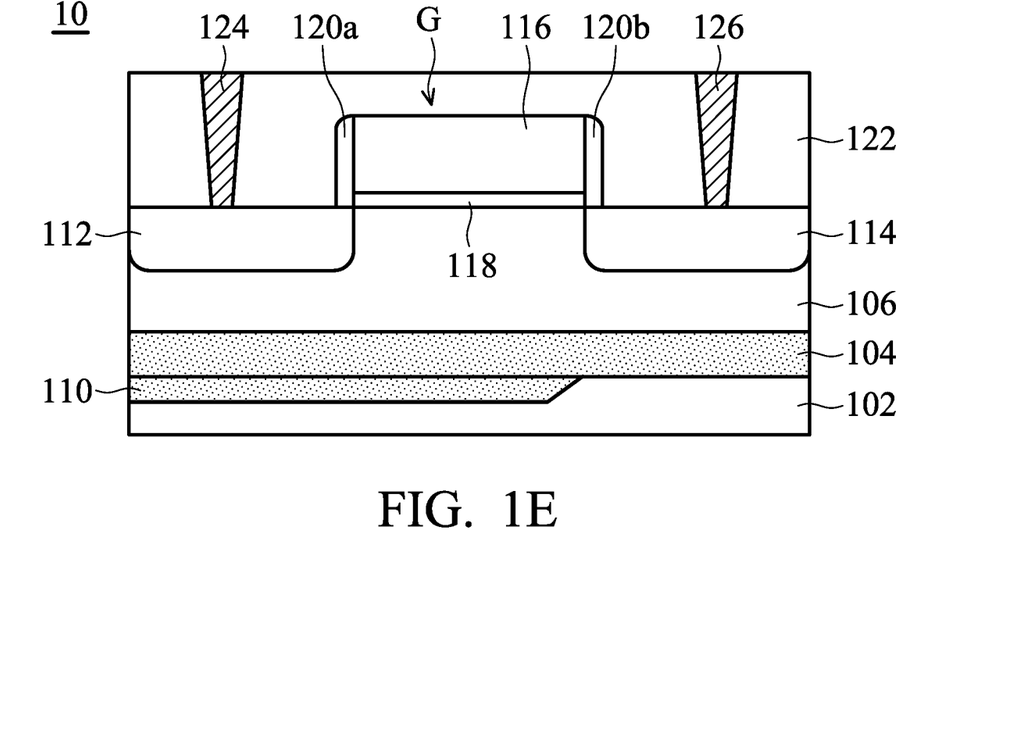

Next, referring to FIG. 1E, an interlayer dielectric (ILD) layer 122 may be formed over the semiconductor layer 106 in accordance with some embodiments. The interlayer dielectric layer 122 may cover the gate stack structure G, the first well region 112 and the second well region 114. The interlayer dielectric layer 122 may be formed of dielectric materials. In some embodiments, the material of the interlayer dielectric layer 122 may include silicon oxide, silicon nitride, phosphosilicate glass (PSG), borophosphosilicate glass (BPSG), other applicable dielectric materials or a combination thereof. In addition, the interlayer dielectric layer 122 may be formed by a chemical vapor deposition (CVD) process, a physical vapor deposition (PVD) process, an atomic layer deposition (ALD) process, a spin coating process, other applicable processes, or a combination thereof.

In addition, as shown in FIG. 1E, after the interlayer dielectric layer 122 is formed, a first via 124 and a second via 126 are formed in the interlayer dielectric layer 122 in accordance with some embodiments. The first via 124 and the second via 126 are disposed corresponding to the first well region 112 and the second well region 114, respectively. The first via 124 and the second via 126 extend from the top surface of the interlayer dielectric layer 122 toward the semiconductor layer 106. The first via 124 and the second via 126 are in contact with the first well region 112 and the second well region 114, respectively.

Moreover, in some embodiments, the first via 124 and the second via 126 are electrically connected to the source electrode/drain electrode (not illustrated), respectively. The formation of the semiconductor device 10 is substantially completed at this stage. In some embodiments, the first via 124 and the second via 126 penetrate the interlayer dielectric layer 122 and are respectively in contact with the source electrode/drain electrode (not illustrated). The source electrode/drain electrode may be electrically connected to the first well region 112 and the second well region 114 through the first via 124 and the second via 126, respectively. In some embodiments, the first via 124 and the second via 126 may be formed of polysilicon, metal, other applicable conductive materials, or a combination thereof. In some embodiments, the first via 124 and the second via 126 each may include copper (Cu), aluminum (Al), molybdenum (Mo), tungsten (W), gold (Au), chromium (Cr), nickel (Ni), platinum (Pt), titanium (Ti), iridium (Ir), rhodium (Rh), copper alloy, aluminum alloy, molybdenum alloy, tungsten alloy, gold alloy, chromium alloy, nickel alloy, platinum alloy, titanium alloy, tantalum alloy, iridium alloy, rhodium alloy, other applicable conductive materials, or a combinations thereof.

It should be understood that the above embodiments take a general metal-oxide-semiconductor field effect transistor (MOSFET) as an exemplary semiconductor device to describe the present disclosure. However, in some other embodiments, any other applicable semiconductor device may be formed over the silicon-on-insulator substrate (e.g., including the substrate 102, the first oxide layer 104, the second oxide layer 110 and the semiconductor layer 106) according to actual needs. For example, other applicable semiconductor devices may include, but are not limited to, complementary metal oxide semiconductor (CMOS) transistors, bipolar junction transistors (BJTs), high-voltage transistors, high-frequency transistors, P-channel and/or N-channel field effect transistors (PFETs/NFETs), diodes, image sensors, or a combination thereof. In some embodiments, the silicon-on-insulator substrate may further include other functional features, such as electrical resistors or capacitors formed in or over the substrate.

Figure 2:
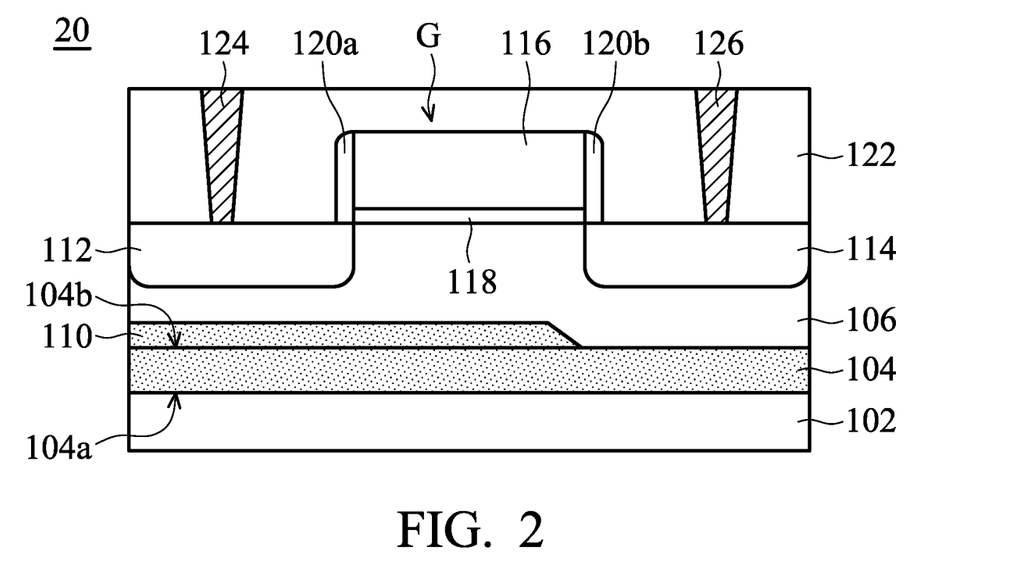
FIG. 2 illustrates a cross-sectional view of the semiconductor structure in accordance with some embodiments of the present disclosure.

Next, refer to FIG. 2, which illustrates a cross-sectional view of a semiconductor structure 20 in accordance with some embodiments of the present disclosure. It should be understood that the same or similar elements or components in above and below contexts are represented by the same or similar reference numerals. The materials, manufacturing methods and functions of these elements or components are the same or similar to those described above, and thus will not be repeated herein. The semiconductor structure 20 in the embodiment shown in FIG. 2 is similar to the semiconductor structure 10 in the embodiment shown in FIG. 1E. The difference between them is that the second oxide layer 110 is disposed between the first oxide layer 104 and the semiconductor layer 106 in the semiconductor structure 20. In this embodiment, the second oxide layer 110 is formed on the second surface 104b of the first oxide layer 104. The second surface 104b is opposite to the first surface 104a and is an interface between the first oxide layer 104 and the semiconductor layer 106. In this embodiment, the second oxide layer 110 extends from the second surface 104b toward the semiconductor layer 106.

Similarly, the second oxide layer 110 may be formed by the ion implantation process 200. Since the interface between the first oxide layer 104 and the semiconductor layer 106 (i.e. the second surface 104b) has more dangling bonds, the ion implantation process 200 may implant oxygen ions to the second surface 104b and the oxygen ions may further extend to the semiconductor layer 106 to form the second oxide layer 110. In some embodiments, the dopant concentration of the ion implantation process 200 may be less than about $1 \times 10^{16}$ atoms/cm$^2$. For example, in some embodiments, the dopant concentration of the ion implantation process 200 may be in a range from about $1 \times 10^{12}$ atoms/cm$^2$ to about $1 \times 10^{16}$ atoms/cm$^2$. In the embodiment shown in FIG. 2, the energy of the ion implantation process 200 that is used to form the second oxide layer 110 is less than the energy of the ion implantation process that is used to form the first oxide layer 104. After the ion implantation process 200 is carried out, an annealing process may be further performed to complete the formation of the second oxide layer 110 in accordance with some embodiments.

In particular, in some embodiments, the formation position of the second oxide layer 110 may be controlled by adjustment of the ion energy used in the ion implantation process 200. For example, the second oxide layer 110 may be controlled to form on the first surface 104a or the second surface 104b of the first oxide layer 104. In some embodiments, the shape, profile etc. of the second oxide layer 110 may also be controlled by adjustment of the ion energy used in the ion implantation process 200.

Figure 3:
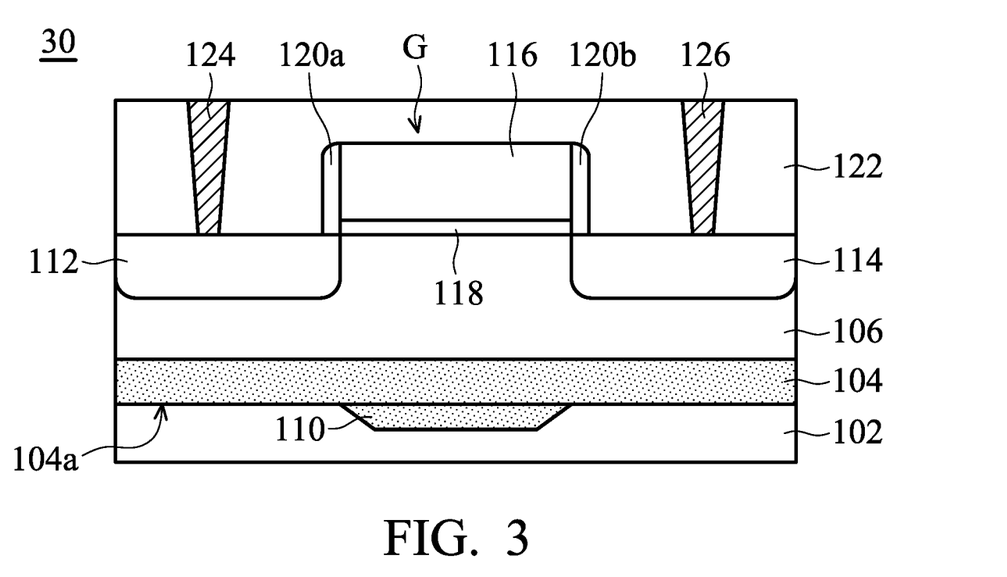
FIG. 3 illustrates a cross-sectional view of the semiconductor structure in accordance with some embodiments of the present disclosure.

Next, refer to FIG. 3, which illustrates a cross-sectional view of the semiconductor structure 30 in accordance with some embodiments of the present disclosure. The semiconductor structure 30 in the embodiment shown in FIG. 3 is substantially similar to the semiconductor structure 10 in the embodiment shown in FIG. 1E. The second oxide layer 110 is also disposed on the first surface 104a of the first oxide layer 104. However, in this embodiment, the second oxide layer 110 substantially does not overlap the first well region 112 and the second well region 114 in the normal direction of the substrate 102. In this embodiment, the second oxide layer 110 substantially overlaps only the gate stack structure G in the normal direction of the substrate 102. In other words, the second oxide layer 110 is disposed between the first well region 112 and the second well region 114.

Figure 4:
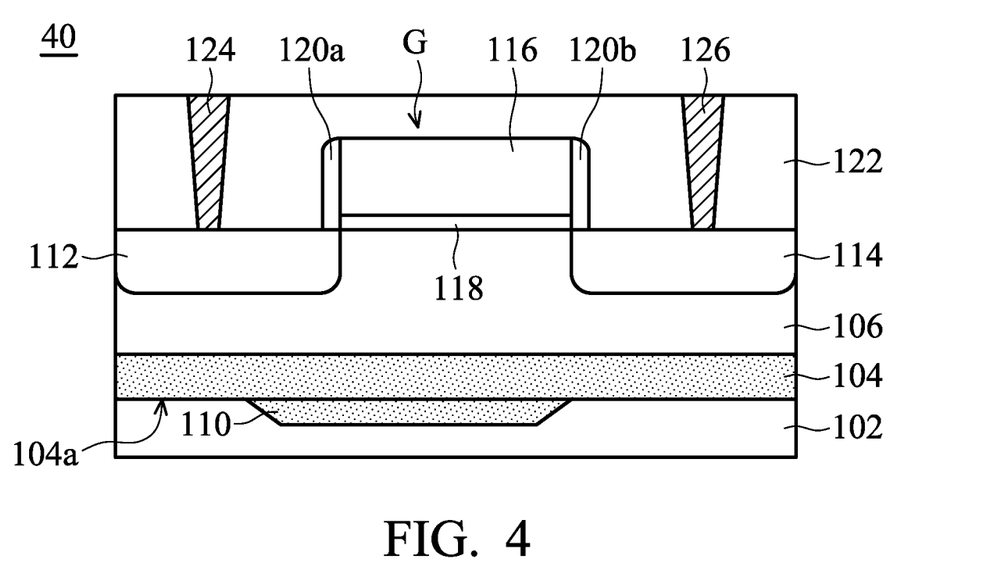
FIG. 4 illustrates a cross-sectional view of the semiconductor structure in accordance with some embodiments of the present disclosure.

Next, refer to FIG. 4, which illustrates a cross-sectional view of the semiconductor structure 40 in accordance with some embodiments of the present disclosure. The semiconductor structure 40 in the embodiment shown in FIG. 4 is substantially similar to the semiconductor structure 10 in the embodiment shown in FIG. 1E. The second oxide layer 110 is also disposed on the first surface 104a of the first oxide layer 104. However, in this embodiment, the second oxide layer 110 merely partially overlaps the first well region 112 in the normal direction of the substrate 102. In this embodiment, the second oxide layer 110 overlaps with the gate stack structure G.

As described above, the thickness of the buried oxide layer in different regions can be adjusted according to need in accordance with various embodiments. For example, the thinner buried oxide layer may be disposed to correspond to the region in the semiconductor structure where the heat dissipation is poorer; on the other hand, the thicker buried oxide layer may be disposed so that it corresponds to the other regions (e.g., the other regions having better heat dissipation). With such a configuration, the parasitic effect and the backside bias effect of the semiconductor device can be reduced, and the effect of heat dissipation of the semiconductor device can be improved.

In accordance with some embodiments of the present disclosure, the semiconductor structure includes a buried oxide layer having different thicknesses corresponding to certain regions (for example, the oxide layer corresponding to the first well region 112 is thicker, while the oxide layer corresponding to the second well region 114 is thinner in the semiconductor structure 10 shown in FIG. 1E). However, the silicon-insulator-silicon substrate structure generally includes a buried oxide layer of substantially the same thickness. For example, in accordance with an example, the semiconductor structure 50 (not illustrated) has a semiconductor structure that is similar to that shown in FIG. 1E, but the semiconductor structure 50 merely includes the first oxide layer 104.

Figure 5A:
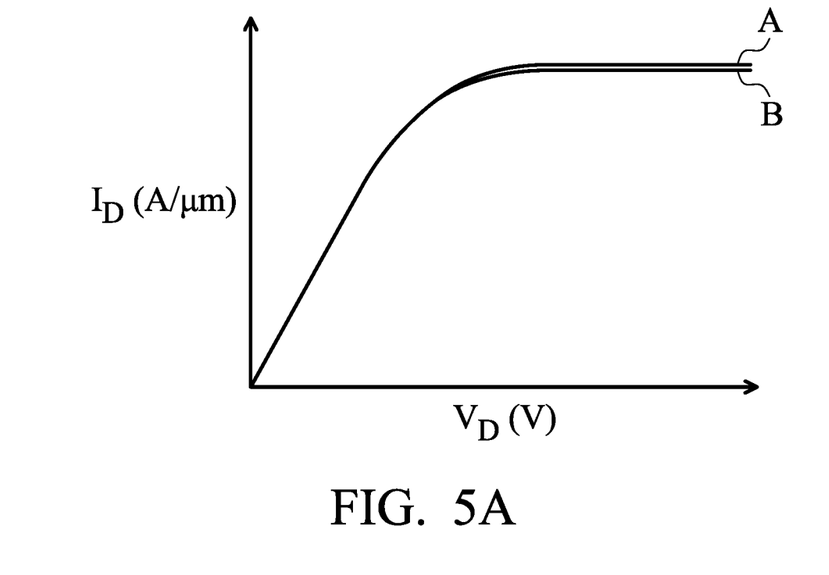
FIG. 5A is the result of the performance test of saturation-region drain current (Idsat) of the semiconductor structures in accordance with some embodiments of the present disclosure.
Figure 5B:
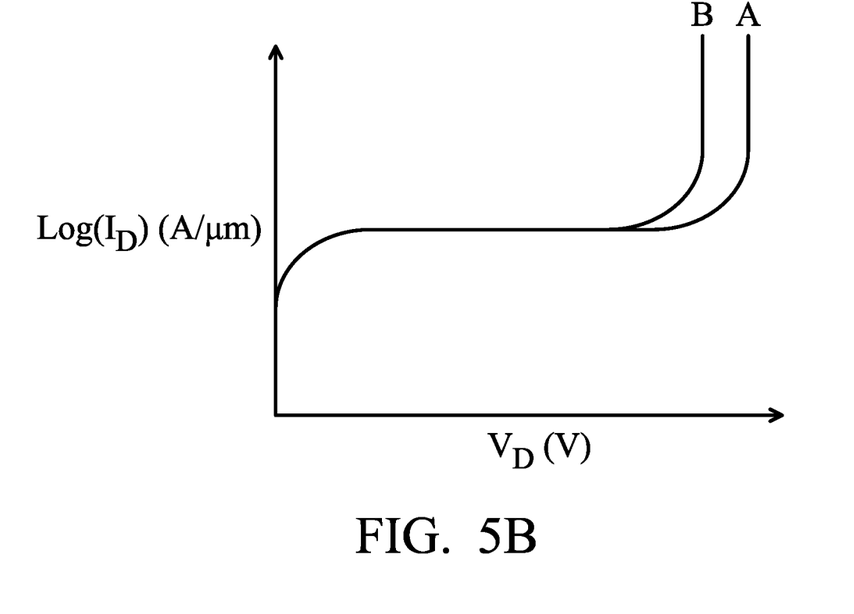
FIG. 5B is the result of the performance test of breakdown voltage of the semiconductor structures in accordance with some embodiments of the present disclosure.

Refer to FIGS. 5A and 5B, which show the results of the performance tests of saturation-region drain current (Idsat) and breakdown voltage of the semiconductor structures in accordance with some embodiments of the present disclosure. FIGS. 5A and 5B show the test results of the semiconductor structure 10 in the embodiments of the present disclosure (indicated by line segment A in the figures) and the exemplary semiconductor structure 50 (indicated by line segment B in the figures). Specifically, FIG. 5A shows a schematic diagram of the test results of the saturation-region drain current (Idsat) of the semiconductor structures in the on state (the horizontal axis and the vertical axis respectively represent the voltage value and the current value of the drain electrode). According to FIG. 5A, it can be known that the semiconductor structure 10 has a higher saturation current in the range of higher operation voltage as compared with the semiconductor structure 50. In addition, FIG. 5B shows a schematic diagram of the test results of the breakdown voltage of the semiconductor structures in the off state (the horizontal axis and the vertical axis respectively represent the voltage value and the logarithmic value of current of the drain electrode). According to FIG. 5B, it can be known that the semiconductor structure 10 has a higher breakdown voltage in the off state as compared with the semiconductor structure 50, and the semiconductor structure 10 can operate at a higher voltage range and have better stability.

To summarize the above, the semiconductor structure provided in the embodiments of the present disclosure includes the buried oxide layer being thicker in certain regions to modulate the body effect. The buried oxide layer may have a thinner thickness in a region corresponding to the position with poorer heat dissipation in the semiconductor structure, and the buried oxide layer corresponding to the other regions may have a thicker thickness. With such a configuration, the parasitic effect and the backside bias effect of the semiconductor device can be reduced, while the effect of heat dissipation of the semiconductor device can also be improved. Therefore, the overall performance of the semiconductor device can be improved. For example, the performance of the saturation-region drain current and the breakdown voltage of the semiconductor device can be further improved.

Although some embodiments of the present disclosure and their advantages have been described in detail, it should be understood that various changes, substitutions and alterations can be made herein without departing from the spirit and scope of the disclosure as defined by the appended claims. For example, it will be readily understood by one of ordinary skill in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor structure, comprising:
   a substrate;
   a first oxide layer disposed over the substrate;
   a second oxide layer disposed at one side of the first oxide layer and in contact with the first oxide layer, wherein the second oxide layer partially overlaps the first oxide layer, and the first oxide layer and the second oxide layer comprise the same oxide;
   a semiconductor layer disposed over the second oxide layer;
   a first well region disposed in the semiconductor layer and having a first conductivity type; and
   a second well region disposed in the semiconductor layer and adjacent to the first well region, wherein the second well region has a second conductivity type that is opposite to the first conductivity type.

2. The semiconductor structure as claimed in claim 1, wherein the second oxide layer overlaps the first well region.

3. The semiconductor structure as claimed in claim 1, wherein the second oxide layer overlaps the first well region and does not overlap the second well region.

4. The semiconductor structure as claimed in claim 1, wherein the first well region and the second well region are a source region and a drain region respectively.

5. The semiconductor structure as claimed in claim 1, wherein the first oxide layer has a first thickness and the second oxide layer has a second thickness, the ratio of the first thickness and the second thickness is in a range from 10:1 to 1:1.

6. The semiconductor structure as claimed in claim 1, wherein the second oxide layer is disposed between the substrate and the first oxide layer.

7. The semiconductor structure as claimed in claim 1, wherein the second oxide layer is disposed between the first oxide layer and the semiconductor layer.

8. The semiconductor structure as claimed in claim 1, further comprising a gate stack structure disposed between the first well region and the second well region.

9. The semiconductor structure as claimed in claim 8, wherein the second oxide layer overlaps the gate stack structure.

10. The semiconductor structure as claimed in claim 1, wherein the same oxide comprises silicon oxide.

11. A method for forming the semiconductor structure as set forth in claim 1, comprising:
    providing a substrate;
    forming a first oxide layer over the substrate;
    forming a semiconductor layer over the first oxide layer;
    forming a second oxide layer on a surface of the first oxide layer by performing an ion implantation process;
    forming a first well region in the semiconductor layer, wherein the first well region has a first conductivity type; and
    forming a second well region in the semiconductor layer, wherein the second well region is adjacent to the first well region and has a second conductivity type that is opposite to the first conductivity type,
    wherein the second oxide layer partially overlaps the first oxide layer, and the first oxide layer and the second oxide layer comprise the same oxide.

12. The method for forming a semiconductor structure as claimed in claim 11, wherein ions are implanted to a first interface between the first oxide layer and the substrate in the ion implantation process.

13. The method for forming a semiconductor structure as claimed in claim 11, wherein ions are implanted to a second interface between the first oxide layer and the semiconductor layer in the ion implantation process.

14. The method for forming a semiconductor structure as claimed in claim 11, further comprising:
   forming a mask layer over a portion of the semiconductor layer that overlaps the second well region before the ion implantation process is performed.

15. The method for forming a semiconductor structure as claimed in claim 11, further comprising:
   forming a second oxide layer by performing an annealing process after the ion implantation process is performed.

16. The method for forming a semiconductor structure as claimed in claim 11, wherein the second oxide layer is formed between the substrate and the first oxide layer.

17. The method for forming a semiconductor structure as claimed in claim 11, wherein the second oxide layer is formed between the first oxide layer and the semiconductor layer.

18. The method for forming a semiconductor structure as claimed in claim 11, wherein the first well region comprises n-type dopants and the second well region comprises p-type dopants.

\* \* \* \* \*